United States Patent [19]

Ickes

[11] Patent Number: 4,892,122

[45] Date of Patent: Jan. 9, 1990

[54] PROBE PIN ALIGNMENT TOOL

[75] Inventor: John M. Ickes, Emmett, Id.

[73] Assignee: Micron Technology Inc., Boise, Id.

[21] Appl. No.: 286,855

[22] Filed: Dec. 19, 1988

[51] Int. Cl.$^4$ .............................................. B21F 1/02
[52] U.S. Cl. ................................... 140/123; 140/147
[58] Field of Search ................. 140/106, 123, 102.5, 140/147, 123.5, 124, 139, 140; 72/479; 220/274, 52 R; 81/15.7; 29/225, 227, 280

[56] References Cited

U.S. PATENT DOCUMENTS

| 2,573,198 | 10/1951 | Hoffman et al. | 140/147 |
| 2,701,589 | 2/1955 | McKinney | 140/102.5 |
| 3,313,189 | 4/1967 | Marra | 81/15.7 |
| 3,742,987 | 7/1973 | Tarbox et al. | 140/147 |
| 3,941,165 | 3/1976 | Bowden et al. | 140/147 |
| 4,510,686 | 4/1985 | Foster | 140/147 |

FOREIGN PATENT DOCUMENTS

| 181562 | 4/1955 | Austria | 140/123 |
| 219444 | 10/1958 | Austria | 140/123 |
| 64749 | 12/1955 | France | 140/123.5 |
| 16946 | 4/1907 | Norway | 220/274 |
| 287773 | 3/1928 | United Kingdom | 140/123.5 |
| 1273289 | 5/1972 | United Kingdom | 140/123.5 |

Primary Examiner—Robert L. Spruill
Attorney, Agent, or Firm—Jon P. Busack; Stan Protigal

[57] ABSTRACT

Apparatus generally for bending wire and particularly for bending and aligning probe pins. The preferred embodiments consists of a small diameter stiff wire with one end formed into a small closed loop, and the other end attached to a handle.

2 Claims, 4 Drawing Sheets

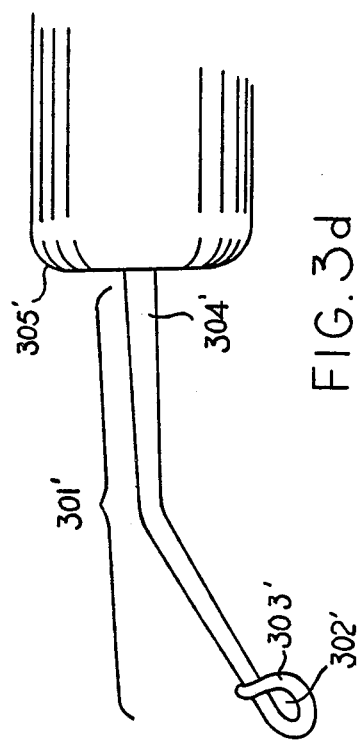

PROBE PIN ALIGNMENT TOOL

FIELD OF THE INVENTION

This invention relates to the maintenance and repair of probe pins located on probe cards such as used during the wafer-sort stage of a semiconductor manufacturing process.

BACKGROUND OF THE INVENTION

In the wafer-sort stage of the manufacturing of semiconductor devices, devices are tested while still in wafer form. In this stage a critical component called a probe card is used. The probe card interfaces a tester to the semiconductor device.

The probe card, depicted in FIG. 1, typically consists of a printed circuit board with probe pins mounted in an epoxy ring, configured such that the tester can be connected to the probe card and have continuity to pads on the semiconductor device via the probe pins touching the pads. The probe pins are generally made of hard, thin, tapered wire, each bent specifically to contact just one pad without contacting neighboring pins or pads.

Because the semiconductor device under test is typically very small, the probe pins are correspondingly small and very close together. In the present application, a typical probe pin diameter might be 1.5 mils at the tip, tapered to 10 mils at the base, and a pad can be 2-4 mils wide, 1-2 mils between it and the next pad. Generally, dozens of pins are required to access all pads on a device. In order for the probe card to properly contact the pads, the tips should be positioned within a 1 mil range in planarity (vertical or z positioning, perpendicular to the card) and 0.1 mil in alignment (horizontal or x-y positioning). 1 mil planarity means that as the probe pins descend on the pads, all tips must contact the pads within 1 mil of descent from the point that a first tip contacts a pad. 0.1 mil alignment means that each probe tip must contact its pad in the center, not varying more than 0.1 mil in any direction. The scale of this can be appreciated when one realizes that a human hair is roughly 4 mils wide (see FIGS. 1 and 2).

Aligning these pins to such tolerances is challenging because they are so small and because they are generally made of a hard material such as tungsten. A probe card is mounted underneath a microscope and each pin is individually, manually worked until it comes within tolerance. This process can take hours.

Precision manipulating hand tools are not available for this work, so the technician constructs his own by bending a sharp tweezer tip into a tiny hook. The hook is then used to pull and stroke the pin this way or that, until the pin is bent to proper alignment. A disadvantage to the hook is that it does not push very well, which can make the process awkward.

SUMMARY OF THE INVENTION

The probe pin alignment tool is simply a stiff wire loop attached to a handle. The loop wire diameter is approximately the same as the diameter of the probe pin to be bent. The loop is slipped over the end of the probe pin, allowing force to be manually applied to the pin in any direction without changing the tool position.

Although bending probe pins is the application of choice, the invention can be applied to bending other sorts of wire.

BRIEF DESCRIPTION OF THE DRAWINGS

FIGS. 3a-3d show some embodiments of the probe pin alignment tool.

DETAILED DESCRIPTION OF THE PREFERRED EMBODIMENTS

Figure 1:
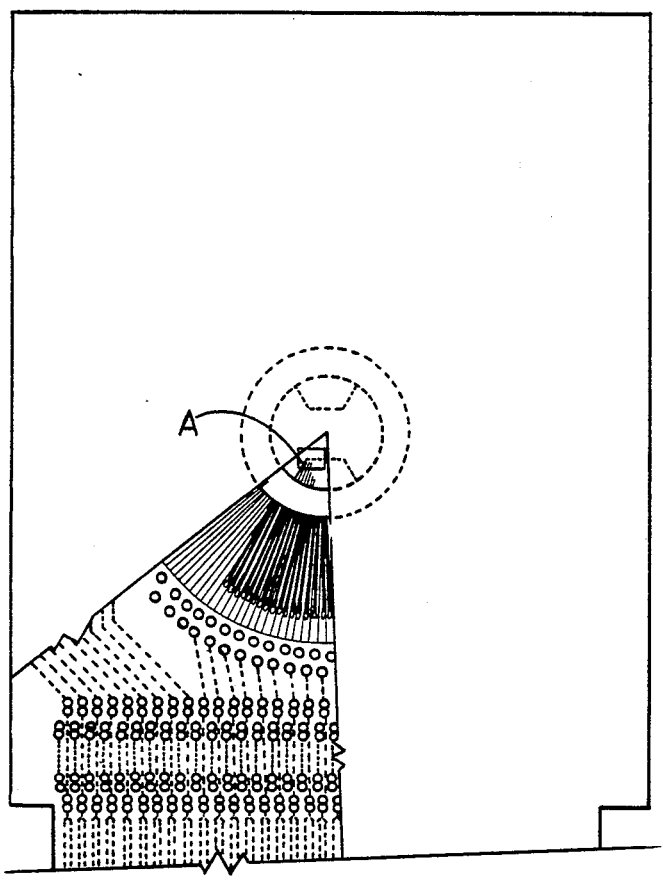
FIG. 1 shows a probe pin portion of a probe card from the underside (the device under test side), actual size.
Figure 2:
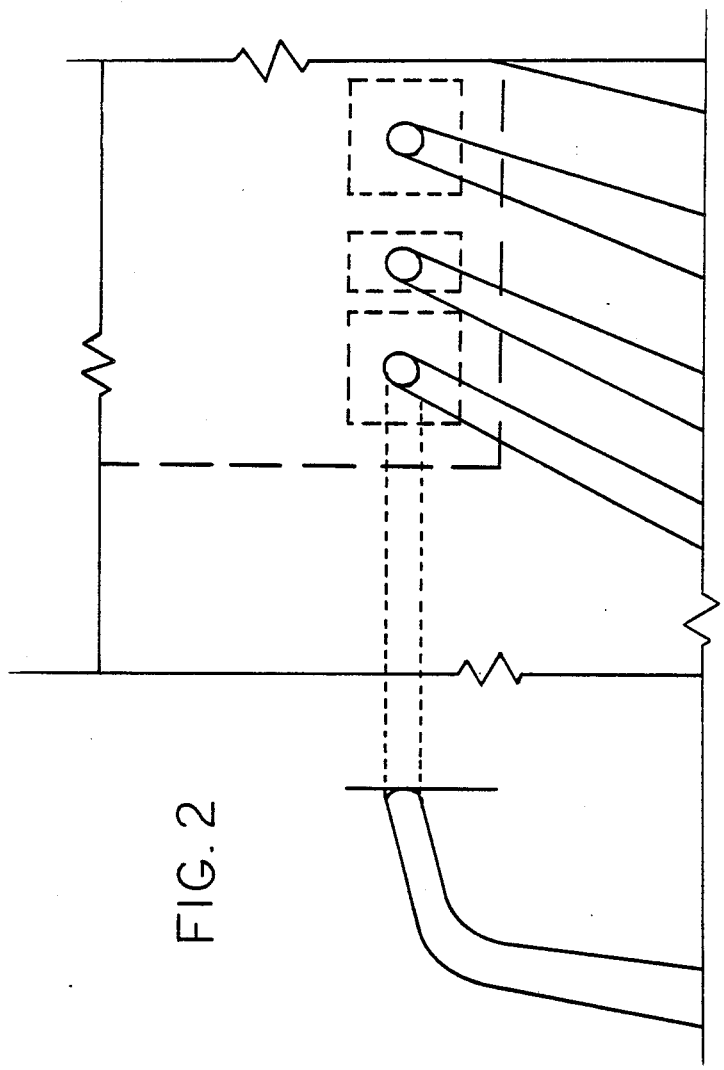
FIG. 2 details box A of FIG. 1, indicating pad positions of a device under test, also showing a side view of a probe pin.
Figure 3A:
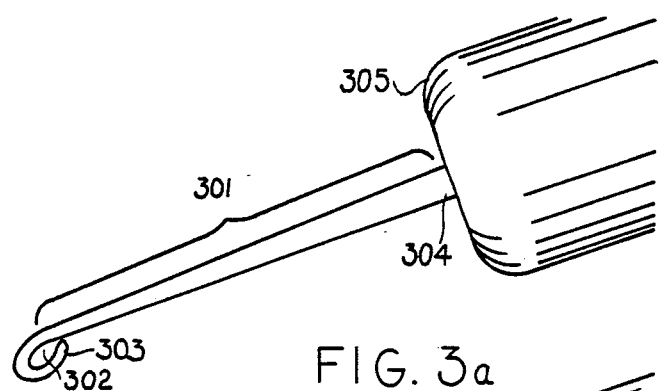
Figure 3B:
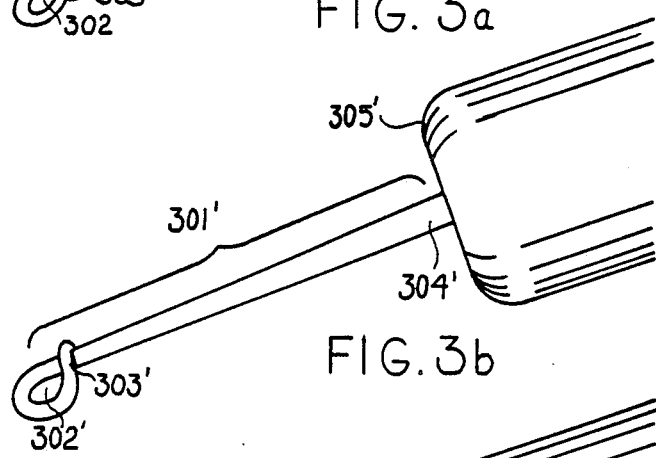
Figure 3C:
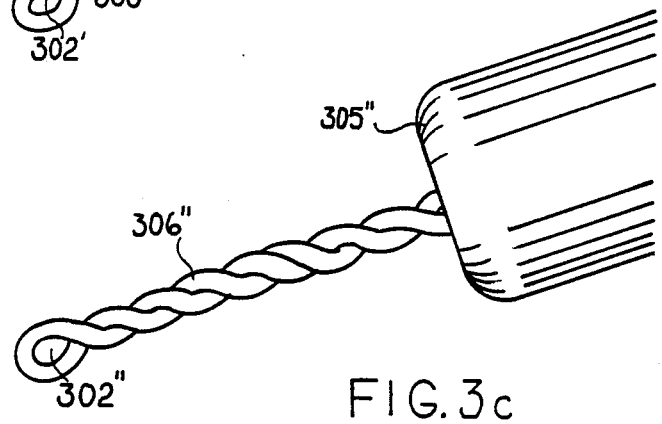

Several embodiments of the invention are shown in FIGS. 3a-3c. All are variations of a shaft-like member 301 having a small loop or aperture 302 at one end 303 and a second end 304 attached to a handle 305. In the original prototype (FIG. 3a) the member 301 is an old probe pin, the narrow end 303 formed into the aperture 302. In this embodiment, the member 301 diameter is about 2-4 mils at the loop 302, and about 10 mils at end 304. The aperture 302 inside diameter is about 4 mils. One important characteristic of the member 301 used is that it should be at least as stiff as the probe pin to be bent.

In use, the user holds the handle 305 and slips the aperture 302 over the end of a probe pin to be bent. The invention is then used to manually bend the probe pin.

The presently preferred embodiment is shown in FIG. 3b. It is different from the embodiment of FIG. 3a in that the wire end 303' is hooked over the shaft 301' to prevent the aperture 302' from flexing open and breaking off.

An alternative embodiment is shown in FIG. 3c, which shows wire 306" folded and twisted, the fold forming the aperture 302", and the twisted wire 306" ends attached to the handle 305".

Clearly, modifications can be made to the invention without stepping outside the claims, such as: the aperture and handle being one element instead of two elements connected together; or the aperture having an angularity or notch on its inside or outside perimeter to aid in catching, forcing and bending a probe pin; a reduced or eliminated shaft; the shaft having one or more bends to help position the loop in tight spaces; the aperture being open; the aperture consisting more than one loop of wire; the aperture and shaft being made of flat stock instead of wire stock.

What is claimed is:

1. Apparatus for bending a probe pin, comprising a member attached to a handle, having a substantially closed aperture with a general diameter larger than a diameter of the probe pin, so that said aperture can be easily positioned around the probe pin, said member being made of wire at least as stiff as the probe pin and having a substantially straight shaft, a first end of said shaft being formed into at least one loop, so making said aperture, and a second end of said shaft connected to said handle, said first end being wrapped at least partially around said shaft, to prevent said aperture from flexing open, and said first end's cross-sectional area being less than said second end's cross-sectional area.

2. The apparatus of claim 1, further comprising:
said shaft having at least one bend to aid in positioning the aperture.

* * * * *